(12) United States Patent
Chang et al.

(10) Patent No.: US 7,851,776 B2
(45) Date of Patent: Dec. 14, 2010

(54) PHASE CHANGE RAM DEVICE

(75) Inventors: Heon Yong Chang, Kyoungki-do (KR); Suk Kyoung Hong, Kyoungki-do (KR); Hae Chan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 604 days.

(21) Appl. No.: 11/445,650

(22) Filed: Jun. 2, 2006

(65) Prior Publication Data

US 2006/0278863 A1 Dec. 14, 2006

(30) Foreign Application Priority Data

Jun. 10, 2005 (KR) .................... 10-2005-0049783

(51) Int. Cl.
*H01L 29/04* (2006.01)
(52) U.S. Cl. ............ 257/2; 257/3; 257/4; 257/E31.029; 438/95; 438/102; 438/103
(58) Field of Classification Search ................. 257/2–4, 257/E31.029; 438/95, 102, 103
See application file for complete search history.

(56) References Cited

U.S. PATENT DOCUMENTS

| 6,358,813 | B1 | | 3/2002 | Holmes et al. | |
|---|---|---|---|---|---|
| 6,462,353 | B1 | * | 10/2002 | Gilgen | 257/3 |
| 7,408,181 | B2 | * | 8/2008 | Chang | 257/4 |
| 2004/0256662 | A1 | | 12/2004 | Black et al. | |
| 2006/0006374 | A1 | * | 1/2006 | Chang | 257/2 |
| 2006/0011902 | A1 | * | 1/2006 | Song et al. | 257/4 |

FOREIGN PATENT DOCUMENTS

| KR | 1020030067363 | 9/2003 |
|---|---|---|
| KR | 1020050001169 | 1/2005 |
| KR | 1020050011609 | 1/2005 |
| KR | 1020050031160 | 4/2005 |

OTHER PUBLICATIONS

Korean Office Action with English Translation.

\* cited by examiner

*Primary Examiner*—Steven Loke
*Assistant Examiner*—Suberr Chi
(74) *Attorney, Agent, or Firm*—Ladas & Parry LLP

(57) ABSTRACT

Disclosed are a phase change RAM device and a method for fabricating a phase change RAM device, which can efficiently lower intensity of current required for changing a phase of a phase change layer. The method includes the steps of providing a semiconductor substrate formed with an insulating interlayer including a tungsten plug, forming a first oxide layer on the semiconductor substrate, forming a pad-type bottom electrode, which makes contact with the tungsten plug, in the first oxide layer, forming a second oxide layer on the first oxide layer including the bottom electrode, and forming a porous polystyrene pattern on the second oxide layer such that a predetermined portion of the second oxide layer corresponding to a center portion of the bottom electrode is covered with the porous polystyrene pattern.

4 Claims, 4 Drawing Sheets

PHASE CHANGE RAM DEVICE

FIELD OF THE INVENTION

The present invention relates to a phase change RAM device. More particularly, the present invention relates to a method for fabricating a phase change RAM device, which can lower the intensity of current required for changing a phase of a phase change layer.

DESCRIPTION OF THE PRIOR ART

As generally known in the art, semiconductor memory devices are generally classified into volatile random access memory (RAM), which loses information stored therein when power is cut off, and non-volatile read only memory (ROM), which continuously retains information stored therein even if power is cut off. Volatile RAM includes dynamic RAM (DRAM) and static RAM (SRAM). Non-volatile ROM includes flash memory such as an electrically erasable and programmable ROM.

As is generally known to those skilled in the art, DRAM memory devices store data by storing electric charges in a capacitor. The charge storage capability of a capacitor is related to the spacing between electrodes, the material between electrodes and the surface area of the electrodes. While DRAM is a memory device known to have superior performance, DRAMs must include storage capacitors, which occupy space in a semiconductor device. Thus a DRAM presents a problem in view of high integration.

Flash memory devices do not require capacitors to store data as do DRAMs but flash memory devices require operational voltages higher than their nominal supply voltage because the flash memory has a stacked structure of two gates. Accordingly, the flash memory must additionally have a booster circuit in order to obtain voltage required for writing and deleting operations, so it is difficult to highly integrate the flash memory.

Many researches have been performed in order to develop new highly integrated memory devices having a simple structure with characteristics of the non-volatile memory devices. As one example of the new highly integrated memory devices, a phase change RAM device has recently been suggested.

The phase change RAM device determines information stored in a cell according to a resistance difference between a crystalline state and an amorphous state of a phase change layer based on the fact that the phase change layer interposed between bottom and top electrodes undergoes phase change from the crystalline state to the amorphous state as the current flows between the bottom and top electrodes.

In other words, the phase change RAM device employs a chalcogenide layer as the phase change layer, and such a chalcogenide layer is a compound layer including Ge, Sb, and Te. The chalcogenide layer undergoes phase change between an amorphous state and a crystalline state as current, that is, joule heat is applied thereto. In this case, since the resistivity of the phase change layer having the amorphous state is higher than the resistivity of the phase change layer having the crystalline state, it is determined whether the information stored in a phase change memory cell is logic "1" or logic "0" by detecting current flowing through the phase change layer in reading and writing modes.

FIG. 1 is a sectional view illustrating the conventional phase change RAM device.

As shown in FIG. 1, gates 4 are formed on an active area of a semiconductor substrate 1, which is defined by an isolation layer, and a junction area (not shown) is formed on the semiconductor substrate at both sides of the gates 4.

An insulating interlayer 5 is formed on an entire surface of the semiconductor substrate 1 in such a manner that the insulating interlayer 5 covers the gates 4. A first tungsten plug 6a and a second tungsten plug 6b are formed at predetermined portions of the insulating interlayer 5 where a phase change cell is formed and a ground voltage (Vss) is applied, respectively.

A first oxide layer 7 is formed on the insulating interlayer 5 having the first tungsten plug 6a and the second tungsten plug 6b. Although it is not shown in detail, a dotted metal pad 8 is formed at an area to be provided with the phase change cell such that the dotted metal pad 8 can make contact with the first tungsten plug 6a, and a bar-type ground line 9 (a Vss line) is formed at an area, to which the ground voltage is applied, such that the bar-type ground line 9 (the Vss line) can make contact with the second tungsten plug 6b.

A second oxide layer 10 is formed on the first oxide layer 7 having the metal pad 8 and the bar-type ground line 9 (the Vss line), and a plug-type bottom electrode 11 is formed in a predetermined portion of the second oxide layer 10 to be provided with the phase change cell such that the plug-type bottom electrode 11 can make contact with the metal pad 8.

A phase change layer 12 and a top electrode 13 are sequentially stacked on the second oxide layer 10 in the form of a pattern such that the phase change layer 12 and the top electrode 13 can make contact with the bottom electrode 11. Accordingly, the phase change cell including the plug-type bottom electrode 11, the phase change layer 12 stacked on the plug-type bottom electrode 11 and the top electrode 13 stacked on the phase change layer 12 is formed.

In addition, a third oxide layer 14 is formed on the second oxide layer 10 such that the third oxide layer 14 can cover the phase change cell, and metal wiring 15 is formed on the third oxide layer 14 such that the metal wiring 15 can make contact with the top electrode 13.

Meanwhile, such a phase change RAM device requires higher current (e.g., current exceeding 1 mA) in order to change the phase of the phase change layer. Thus, it is necessary to lower intensity of current required for the phase change of the phase change layer by reducing a contact area between the phase change layer and the electrode. To this end, conventionally, the plug-type bottom electrode having the size smaller than 100 nm is formed through an electron-beam process (E-beam process).

However, since the E-beam process is unstable, it is difficult to precisely form the bottom electrode having a desired size through the E-beam process. In particular, it is impossible to uniformly form the bottom electrode over the whole area of the semiconductor substrate through the E-beam process. For this reason, the contact area between the bottom electrode and the phase change layer is irregularly formed over the whole area of the semiconductor device, so the range of writing current of the phase change layer is increased.

SUMMARY OF THE INVENTION

In light of the foregoing problems in the prior art, an object of the present invention is to provide a phase change RAM device and a method for fabricating the same, which can efficiently reduce current required for changing a phase of a phase change layer.

Another object of the present invention is to provide a phase change RAM device and a method for fabricating the same, which can uniformly form the contact area between a bottom electrode and a phase change layer over the whole area of a semiconductor substrate.

To accomplish the above and other objects, there is provided a phase change RAM device including an oxide layer formed on a semiconductor substrate including a predetermined base layer, a pad-type bottom electrode formed in the oxide layer, a masking pattern formed on the bottom electrode so as to shield a center part of the bottom electrode and expose only a peripheral portion of the bottom electrode, a phase change layer formed on the oxide layer including the masking pattern and the exposed peripheral portion of the bottom electrode, and a top electrode formed on the phase change layer.

The masking pattern includes an oxide layer and has a nano size.

According to another aspect of the present invention, there is provided a method for fabricating a phase change RAM device, the method including the steps of providing a semiconductor substrate formed with an insulating interlayer including a tungsten plug, forming a first oxide layer on the semiconductor substrate, forming a pad-type bottom electrode, which makes contact with the tungsten plug, in the first oxide layer, forming a second oxide layer on the first oxide layer including the bottom electrode, forming a porous polystyrene pattern on the second oxide layer such that a predetermined portion of the second oxide layer corresponding to a center portion of the bottom electrode is covered with the porous polystyrene pattern, forming an oxide layer pattern exposing a peripheral portion of the bottom electrode while shielding the center portion of the bottom electrode by etching the second oxide layer using the porous polystyrene pattern, removing the porous polystyrene pattern, and sequentially forming a phase change layer making contact with the exposed peripheral portion of the bottom electrode and a top electrode on the second oxide layer including the oxide layer pattern and the exposed peripheral portion of the bottom electrode.

The bottom electrode is formed through a damascene process and includes one selected from the group consisting of TiN, TiW, Al, Cu, and WSi.

The porous polystyrene pattern is formed by removing poly-methyl-methacrylate from a diblock copolymer layer including polystyrene and poly-methyl-methacrylate using organic solvent.

The second oxide layer is etched using CHF3 gas and Ar gas.

The oxide layer pattern is formed with a nano size.

The phase change layer includes one selected from the group consisting of Ge—Sb—Te, Ge—Bi—Te, Sb—Te doped with at least one of Ag, In, and Bi, and Bi—Te doped with at least one of Ag, In, and Sn.

The top electrode includes one selected from the group consisting of Al, Ti, Ta, TaSiN, TaN, Ru, TiW, TiN and TiAlN.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
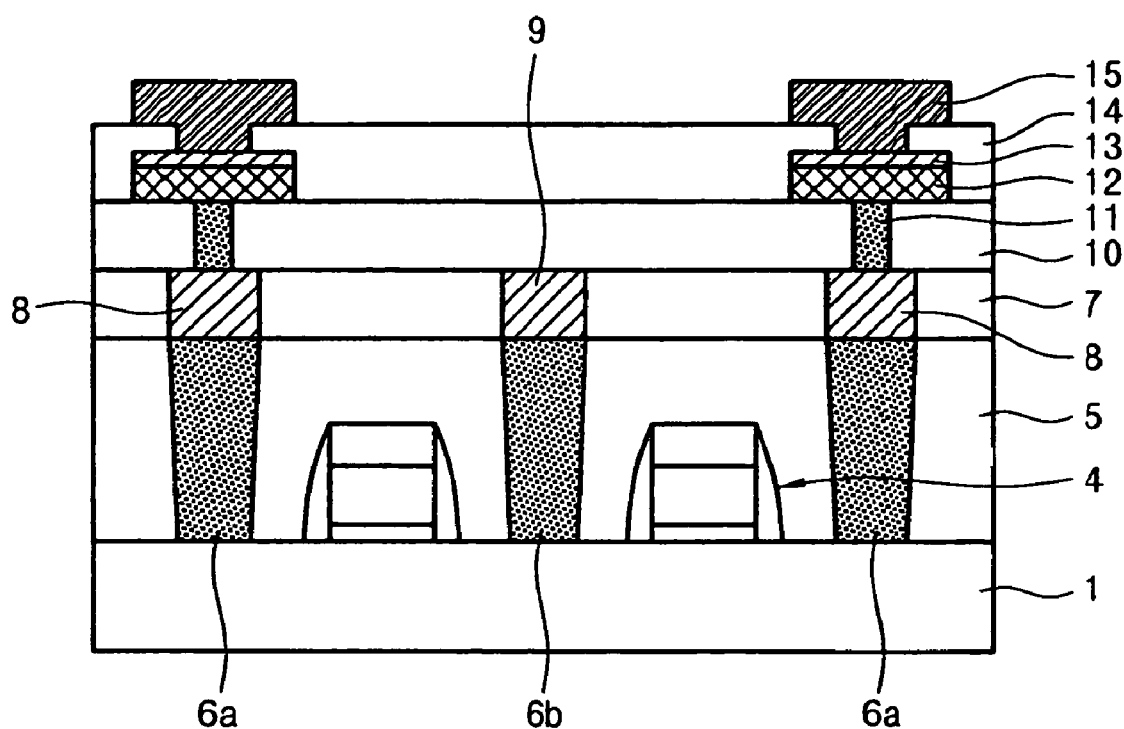
FIG. 1 is a sectional view illustrating the conventional phase change RAM device.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2a to 2e are sectional views illustrating both a phase change memory device and the manufacturing procedure for a making a phase change RAM device.

Figure 2A:
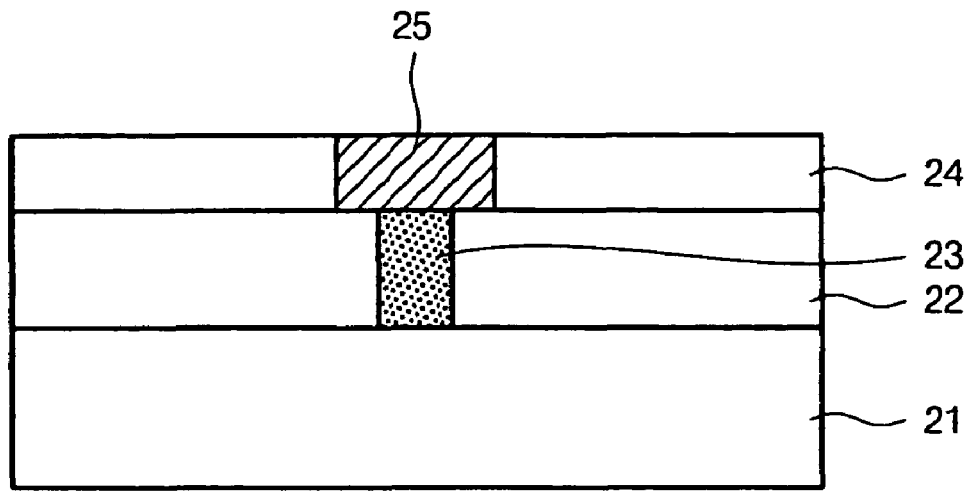
FIGS. 2a to 2e are sectional views illustrating the manufacturing procedure for a phase change RAM device according to the present invention.

Referring to FIG. 2a, a semiconductor substrate 21 having a base layer (not shown) is formed with an isolation layer and a transistor. Then, after forming an insulating interlayer 22 on the semiconductor substrate 21 such that the insulating interlayer 22 can cover the base layer, the surface of the insulating interlayer 22 is planarized.

Thereafter, the insulating interlayer 22 is etched in order to form a contact hole for exposing a predetermined portion of the semiconductor substrate to be provided with the phase change cell, that is, a drain area of a transistor. Then, a tungsten plug 23 making contact with the drain area is formed by filling the contact hole with a conductive layer (e.g., a tungsten layer).

Sequentially, a first oxide layer 24 is formed on the insulating interlayer 22 including the tungsten plug 23. Then, according to a typical damascene process, the first oxide layer 24 is etched, thereby forming a hole for exposing the tungsten plug 23 and a pad-type bottom electrode 25 making contact with the tungsten plug 23 is formed by filling the hole with bottom electrode materials. The bottom electrode material includes TiN, TiW, Al, Cu, or WSi. Unlike the prior art technique in which a bottom electrode is formed through an E-beam process in order to reduce a contact area between the bottom electrode and a phase change layer, the bottom electrode 25 is formed through the damascene process, which is stably performed, so that the bottom electrode 25 can be easily formed. In addition, it is possible to uniformly form the bottom electrode over the whole area of the semiconductor substrate.

Figure 2B:
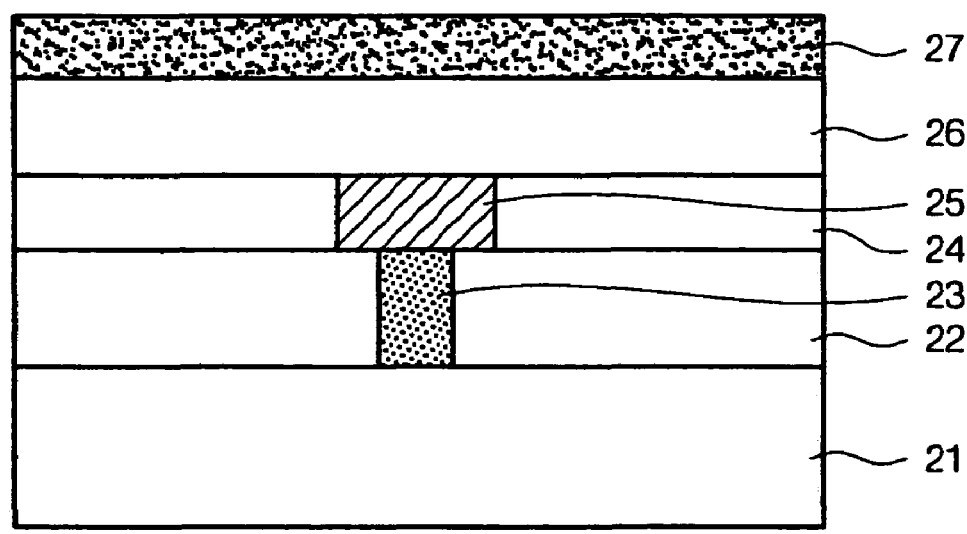

Referring to FIG. 2b, in order to form a masking pattern exposing only a peripheral portion of the bottom electrode 25 while shielding a center part of the bottom electrode 25, a second oxide layer 26 is formed on the first oxide layer 24 including the bottom electrode 25, and then a diblock copolymer layer 27 is formed on the second oxide layer 26. Herein, the diblock copolymer layer 27 includes polystyrene (PS) and poly-methyl-methacrylate (PMMA) and has a structure provided with a hexagonal close-packed PMMA cylinder formed in a PS matrix.

Figure 2C:
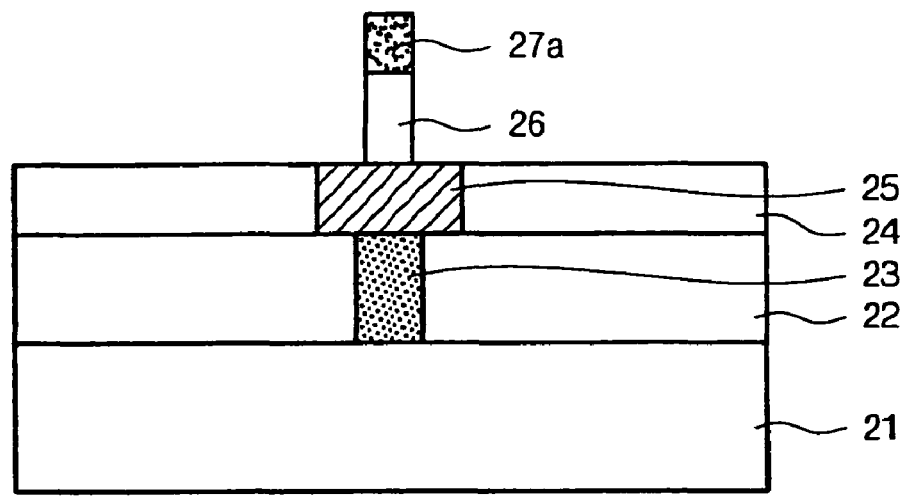

Referring to FIG. 2c, a nano-sized porous PS pattern 27a is formed on a predetermined portion of the second oxide layer 26 provided on the bottom electrode 25 by removing PMMA from the diblock copolymer layer using organic solvent. Then, the second oxide layer 26 is etched using CHF3 and Ar while employing the porous PS pastern 27a as an etching barrier. Thus, a nano-sized oxide layer pattern 26a, which exposes only a peripheral portion of the bottom electrode 25 while shielding the center part of the bottom electrode 25, is formed.

Figure 2D:
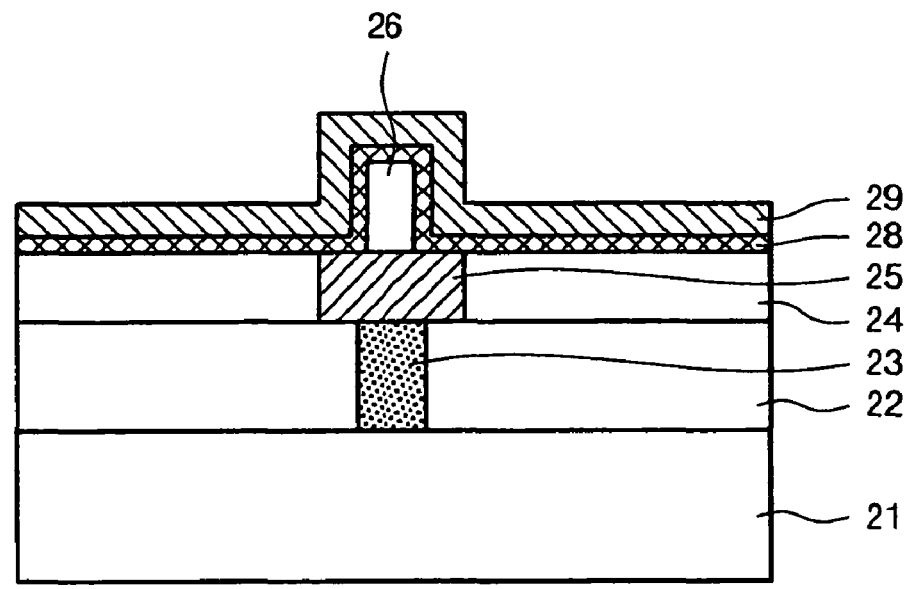

Referring to FIG. 2d, an oxygen plasma process is performed with respect to the resultant substrate so as to remove the remaining porous PS pattern 27a. Then, a phase change material layer 28 and a top electrode material layer 29 are sequentially deposited on the first oxide layer 24 including the oxide layer pattern 26a and the exposed peripheral portion of the bottom electrode 25.

Herein, the phase change material layer 28 includes Ge—Sb—Te, Ge—Bi—Te, Sb—Te doped with at least one of Ag, In, and Bi, or Bi—Te doped with at least one of Ag, In, and Sn. The top electrode material layer 29 includes Al, Ti, Ta, TaSiN, TaN, Ru, TiW, TiN, or TiAlN.

Figure 2E:
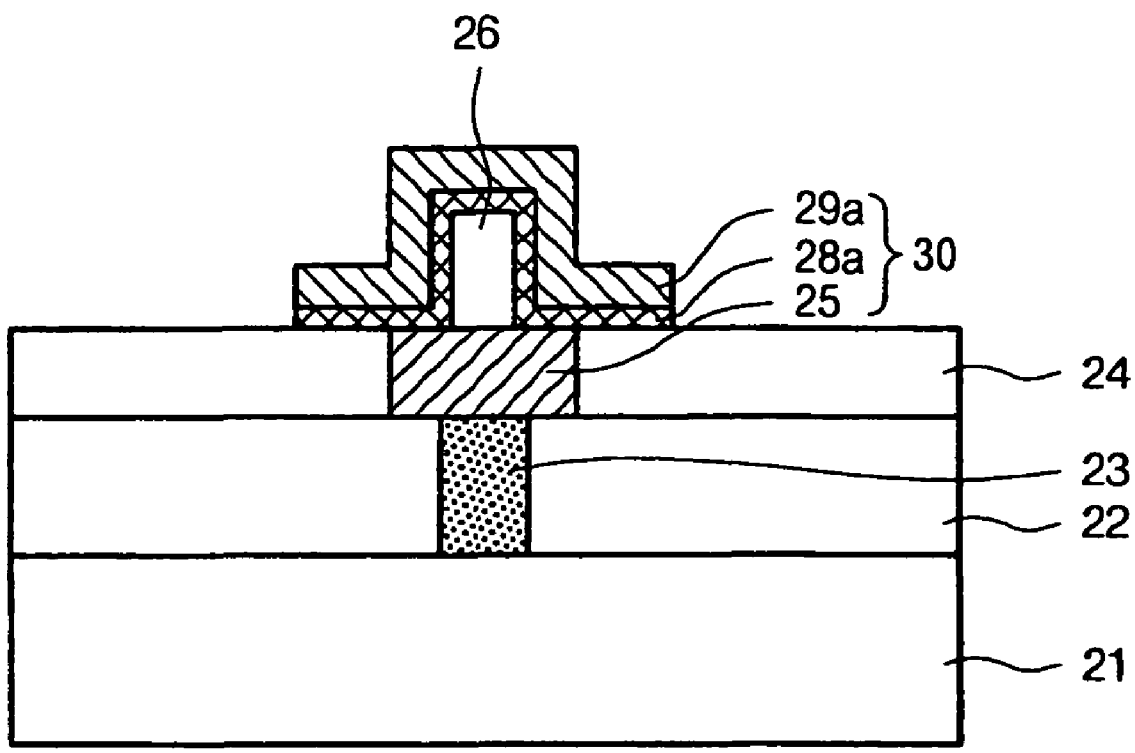

Referring to FIG. 2e, a top electrode 29a and a phase change layer 28a are formed by etching the phase change material layer 28 and the top electrode material layer 29 through any appropriate etching process. Thus, a phase change cell 30 including the pad-type bottom electrode 25, the phase change layer 28a stacked on the pad-type bottom electrode 25, and the top electrode 29a stacked on the phase change layer 28a is formed.

Herein, since the bottom electrode 25 makes contact with the phase change layer 28a at the peripheral portion of the bottom electrode 25, it is possible to reduce the contact area between the bottom electrode 25 and the phase change layer 28a as compared with that of the conventional technique. Therefore, according to the present invention, it is possible to efficiently lower intensity of writing current required for phase change of the phase change layer 28a as compared with that of the conventional technique.

Thereafter, although it is not shown, typical following processes including a metal wiring process are sequentially performed, thereby obtaining the phase change RAM device according to the present invention.

As described above, according to the present invention, a phase change layer and a top electrode are formed under the state in which an oxide layer pattern exposing a peripheral portion of a bottom electrode while shielding a center part of the bottom electrode has been formed on the bottom electrode using a diblock copolymer layer, so that it is possible to reduce a contact area between the bottom electrode and the phase change layer as compared with that of the conventional technique. Accordingly, it is possible to efficiently reduce writing current required for phase change of the phase change layer.

In addition, according to the present invention, since a bottom electrode is fabricated in the form of a pad rather than a plug, it is easy to fabricate the bottom electrode.

Furthermore, according to the present invention, since the bottom electrode is fabricated in the form of a pad through a stable damascene process instead of an E-beam process, it is possible to uniformly form the bottom electrode over the whole area of a semiconductor substrate. Accordingly, it is possible to uniformly form the contact area between the bottom electrode and the phase change layer over the whole area of the semiconductor substrate, so that writing current in a chip can be lowered.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase change RAM device comprising:
an insulating layer formed over a semiconductor substrate and including a conductive plug formed therein;
an oxide layer formed over the insulating layer;
a pad-type bottom electrode formed in the oxide layer and in contact with the conductive plug, wherein the pad-type bottom electrode has a height substantially equal to a height of the oxide layer;
a masking pattern formed over the bottom electrode so as to shield a center part of the pad-type bottom electrode and expose only a peripheral portion of the pad-type bottom electrode, such that a bottom surface of the masking pattern is above an upper surface of the oxide layer;
a phase change layer formed directly over the oxide layer and covering a top surface and a side surface of the masking pattern, so as to completely shield the masking pattern, and covering an entire exposed peripheral portion of the bottom electrode; and
a top electrode formed on and abutting the phase change layer.

2. The phase change RAM device as claimed in claim 1, wherein the masking pattern includes an oxide layer.

3. The phase change RAM device as claimed in claim 1, wherein the masking pattern includes a nano-sized masking pattern.

4. The phase change RAM device as claimed in claim 1, wherein the top electrode is formed over an upper surface and a side surface of the phase change layer.

* * * * *